(12) United States Patent
Hofmann et al.

(10) Patent No.: US 9,581,890 B2
(45) Date of Patent: Feb. 28, 2017

(54) EXTREME ULTRAVIOLET REFLECTIVE ELEMENT WITH MULTILAYER STACK AND METHOD OF MANUFACTURING THEREOF

(71) Applicant: Applied Materials, Inc., Santa Clara, CA (US)

(72) Inventors: Ralf Hofmann, Soquel, CA (US); Vinayak Vishwanath Hassan, Santa Clara, CA (US); Cara Beasley, Scotts Valley, CA (US); Majeed A. Foad, Sunnyvale, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 80 days.

(21) Appl. No.: 14/696,325

(22) Filed: Apr. 24, 2015

(65) Prior Publication Data

US 2016/0011502 A1    Jan. 14, 2016

Related U.S. Application Data

(60) Provisional application No. 62/023,460, filed on Jul. 11, 2014.

(51) Int. Cl.
| | |
|---|---|
| *G03F 1/24* | (2012.01) |
| *C23C 16/44* | (2006.01) |
| *H01J 37/32* | (2006.01) |
| *H01J 37/34* | (2006.01) |
| *C23C 14/06* | (2006.01) |

(Continued)

(52) U.S. Cl.
CPC ............ *G03F 1/24* (2013.01); *C23C 14/0605* (2013.01); *C23C 14/0635* (2013.01); *C23C 14/14* (2013.01); *C23C 16/44* (2013.01); *G03F 7/70033* (2013.01); *G03F 7/70316* (2013.01);
(Continued)

(58) Field of Classification Search
CPC ................................. G03F 1/24; C23C 16/44
See application file for complete search history.

(56) References Cited

U.S. PATENT DOCUMENTS

| | | |
|---|---|---|
| 6,228,512 B1 | 5/2001 | Bajt et al. |
| 6,396,900 B1 | 5/2002 | Barbee, Jr. et al. |

(Continued)

FOREIGN PATENT DOCUMENTS

| | | |
|---|---|---|
| JP | 2005302860 A | 10/2005 |
| JP | 2006173490 A | 6/2006 |

(Continued)

OTHER PUBLICATIONS

International Search Report and Written Opinion for PCT App # PCT/US2015/039160 dated Sep. 22, 2015.

(Continued)

*Primary Examiner* — Stephen Rosasco
(74) *Attorney, Agent, or Firm* — Servilla Whitney LLC

(57) ABSTRACT

An apparatus and method of manufacture of an extreme ultraviolet reflective element includes: a substrate; a multilayer stack on the substrate, the multilayer stack includes a plurality of reflective layer pairs having a first reflective layer formed from silicon and a second reflective layer formed from niobium or niobium carbide for forming a Bragg reflector; and a capping layer on and over the multilayer stack for protecting the multilayer stack by reducing oxidation and mechanical erosion.

20 Claims, 6 Drawing Sheets

(51) Int. Cl.
  *C23C 14/14*    (2006.01)
  *G03F 7/20*    (2006.01)
  *G21K 1/06*    (2006.01)

(52) U.S. Cl.
  CPC ........ *G21K 1/062* (2013.01); *H01J 37/32798* (2013.01); *H01J 37/3429* (2013.01)

(56) References Cited

U.S. PATENT DOCUMENTS

| | | |
|---|---|---|
| 6,756,163 B2 | 6/2004 | Yan |
| 6,869,734 B1 | 3/2005 | Lyons et al. |
| 7,282,307 B2 | 10/2007 | Hector et al. |
| 7,300,724 B2 | 11/2007 | Yan |
| 7,599,112 B2 | 10/2009 | Shiraishi |
| 7,771,895 B2 | 8/2010 | Wu et al. |
| RE42,338 E | 5/2011 | Singh et al. |
| 8,144,830 B2 | 3/2012 | Yakshin et al. |
| 8,409,770 B2 | 4/2013 | Jeong |
| 8,501,373 B2 | 8/2013 | Schwarzl et al. |
| 8,764,995 B2 | 7/2014 | Chang et al. |
| 8,802,335 B2 | 8/2014 | Oh et al. |
| 8,936,889 B2 | 1/2015 | Deweerd |
| 2003/0008148 A1 | 1/2003 | Bajt et al. |
| 2003/0190473 A1 | 10/2003 | Argoitia et al. |
| 2004/0121134 A1 | 6/2004 | Bijkerk et al. |
| 2006/0127780 A1 | 6/2006 | Chandhok et al. |
| 2007/0020903 A1 | 1/2007 | Takehara et al. |
| 2007/0054196 A1 | 3/2007 | Lee et al. |
| 2007/0090084 A1 | 4/2007 | Yan et al. |
| 2010/0027107 A1 | 2/2010 | Yakshin |
| 2010/0066991 A1 | 3/2010 | Schwarzl et al. |
| 2010/0119981 A1 | 5/2010 | Schwarzl et al. |
| 2014/0217298 A1* | 8/2014 | Wang .................. G01N 21/956 250/372 |
| 2014/0268081 A1 | 9/2014 | Hofmann et al. |

FOREIGN PATENT DOCUMENTS

| | | |
|---|---|---|
| KR | 1020050049011 A | 5/2005 |
| KR | 1020100127676 A | 12/2010 |

OTHER PUBLICATIONS

U.S. Appl. No. 14/696,322, filed Apr. 24, 2015, Beasley et al.
U.S. Appl. No. 14/696,331, filed Apr. 24, 2015, Hofmann et al.
Yulin et al., MoSi ML with enhanced TiO2 and RuO2 capping layers, Proc. of SPIE, 2008, pp. 10, vol. 6921, No. 692118, Emerging Lithographic Technologies XII.
International Search Report & Written Opinion for PCT App No. PCT/US2015/039158 dated Oct. 14, 2015.
International Search Report & Written Opinion for PCT App No. PCT/US2015/039159 dated Oct. 14, 2015.
Non-Final Office Action in U.S. Appl. No. 14/696,331 dated Sep. 19, 2016, 31 pages.
Non-Final Office Action in U.S. Appl. No. 14/696,322 dated Sep. 20, 2016, 39 pages.

* cited by examiner

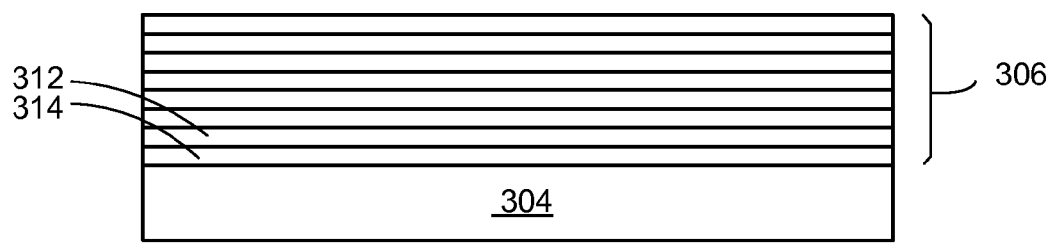
FIG. 6
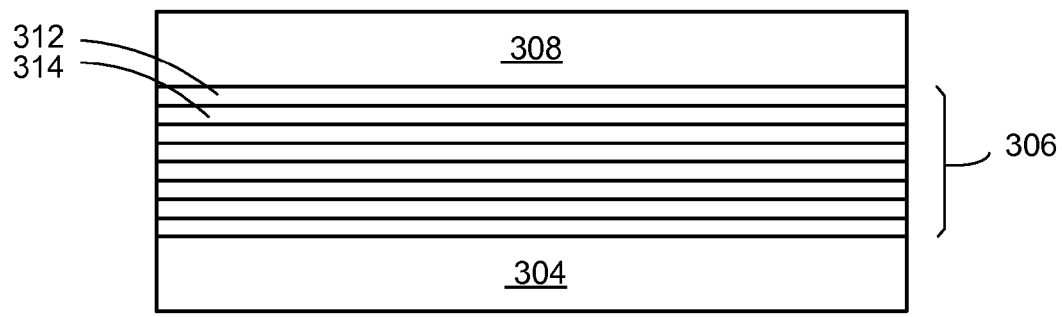
FIG. 7
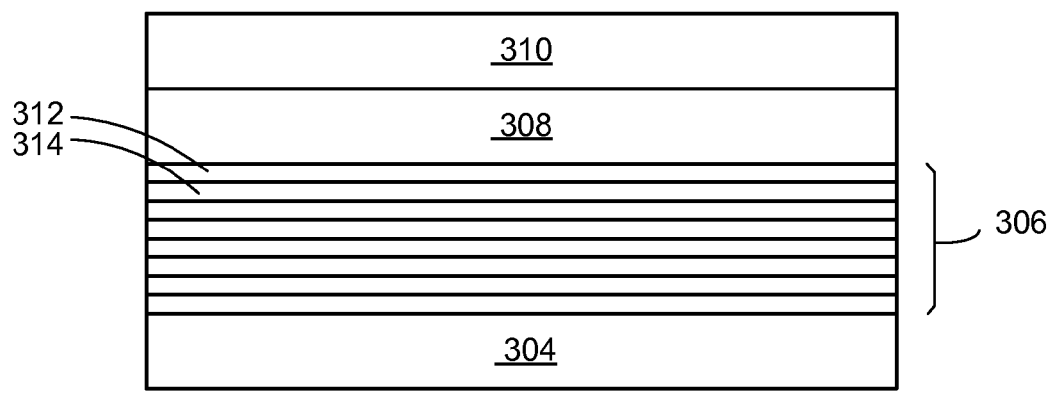
FIG. 8
FIG. 9

EXTREME ULTRAVIOLET REFLECTIVE ELEMENT WITH MULTILAYER STACK AND METHOD OF MANUFACTURING THEREOF

CROSS-REFERENCE TO RELATED APPLICATION(S)

This application claims the benefit of U.S. Provisional Patent Application Ser. No. 62/023,460 filed Jul. 11, 2014, and the subject matter thereof is incorporated herein by reference thereto.

The present application contains subject matter related to concurrently filed U.S. patent application Ser. No. 14/696, 322 filed Apr. 24, 2015. The related application is assigned to Applied Materials, Inc. and the subject matter thereof is incorporated herein by reference thereto.

The present application contains subject matter related to concurrently filed U.S. patent application Ser. No. 14/696, 331 filed Apr. 24, 2015. The related application is assigned to Applied Materials, Inc. and the subject matter thereof is incorporated herein by reference thereto.

TECHNICAL FIELD

The present invention relates generally to extreme ultraviolet lithography, and more particularly to multilayer stacks, manufacturing systems, and lithography systems for extreme ultraviolet reflective elements for extreme ultraviolet lithography.

BACKGROUND

Modern consumer and industrial electronic systems are growing ever more complex. Electronic devices require higher density electronic components in smaller and more flexible packages. As component densities increase, technology changes are required to satisfy the demand for higher density devices with smaller feature sizes. Extreme ultraviolet lithography, also known as soft x-ray projection lithography, is a photolithographic process for the manufacture of 0.13 micron, and smaller, minimum feature size semiconductor devices.

Extreme ultraviolet light, which can generally in the 5 to 50 nanometers (nm) wavelength range, is strongly absorbed by most elements. For that reason, extreme ultraviolet systems work by reflection rather than by transmission of light. Extreme ultraviolet radiation can be projected through a series of reflective components, including mirror assemblies and a mask blank coated with a non-reflective mask pattern, and directed onto semiconductor wafers to form high density, small feature size semiconductor devices.

The reflective components of extreme ultraviolet lithography systems can include reflective multilayer coatings of materials. Because of the high power levels of the extreme ultraviolet light, the remaining non-reflected extreme ultraviolet light causes thermal heating that can degrade reflectivity of the reflective components over time and can result in limited lifetimes for the reflective components.

In view of the need for the increasingly smaller feature size of electronic components, it is increasingly critical that answers be found to these problems. In view of the ever-increasing commercial competitive pressures, along with growing consumer expectations, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

The embodiments of the present invention provides a method of manufacture of an extreme ultraviolet reflective element that includes: providing a substrate; forming a multilayer stack on the substrate, the multilayer stack includes a plurality of reflective layer pairs having a first reflective layer formed from silicon and a second reflective layer formed from niobium or niobium carbide for forming a Bragg reflector; and forming a capping layer on and over the multilayer stack for protecting the multilayer stack by reducing oxidation and mechanical erosion.

The embodiments of the present invention provides an extreme ultraviolet reflective element that includes: a substrate; a multilayer stack on the substrate, the multilayer stack includes a plurality of reflective layer pairs having a first reflective layer formed from silicon and a second reflective layer formed from niobium or niobium carbide for forming a Bragg reflector; and a capping layer on and over the multilayer stack for protecting the multilayer stack by reducing oxidation and mechanical erosion.

The embodiments of the present invention provides an extreme ultraviolet reflective element production system that includes: a first deposition system for depositing a multilayer stack on the substrate, the multilayer stack including a plurality of reflective layer pairs having a first reflective layer formed from silicon and a second reflective layer formed from niobium or niobium carbide for forming a Bragg reflector; and a second deposition system for forming a capping layer on the multilayer stack for protecting the multilayer stack by reducing oxidation and mechanical erosion.

Certain embodiments of the invention have other phases or elements in addition to or in place of those mentioned above. The phases or element will become apparent to those skilled in the art from a reading of the following detailed description when taken with reference to the accompanying drawings.

BRIEF DESCRIPTION OF THE DRAWINGS

FIG. 6 is the structure of FIG. 3 in a provisioning phase of manufacturing.

FIG. 7 is the structure of FIG. 6 in a layering phase of manufacturing.

FIG. 8 is the structure of FIG. 7 in a protective phase of manufacturing.

FIG. 9 is the structure of FIG. 8 in a pre-patterning phase of manufacturing.

DETAILED DESCRIPTION

Figure 1:
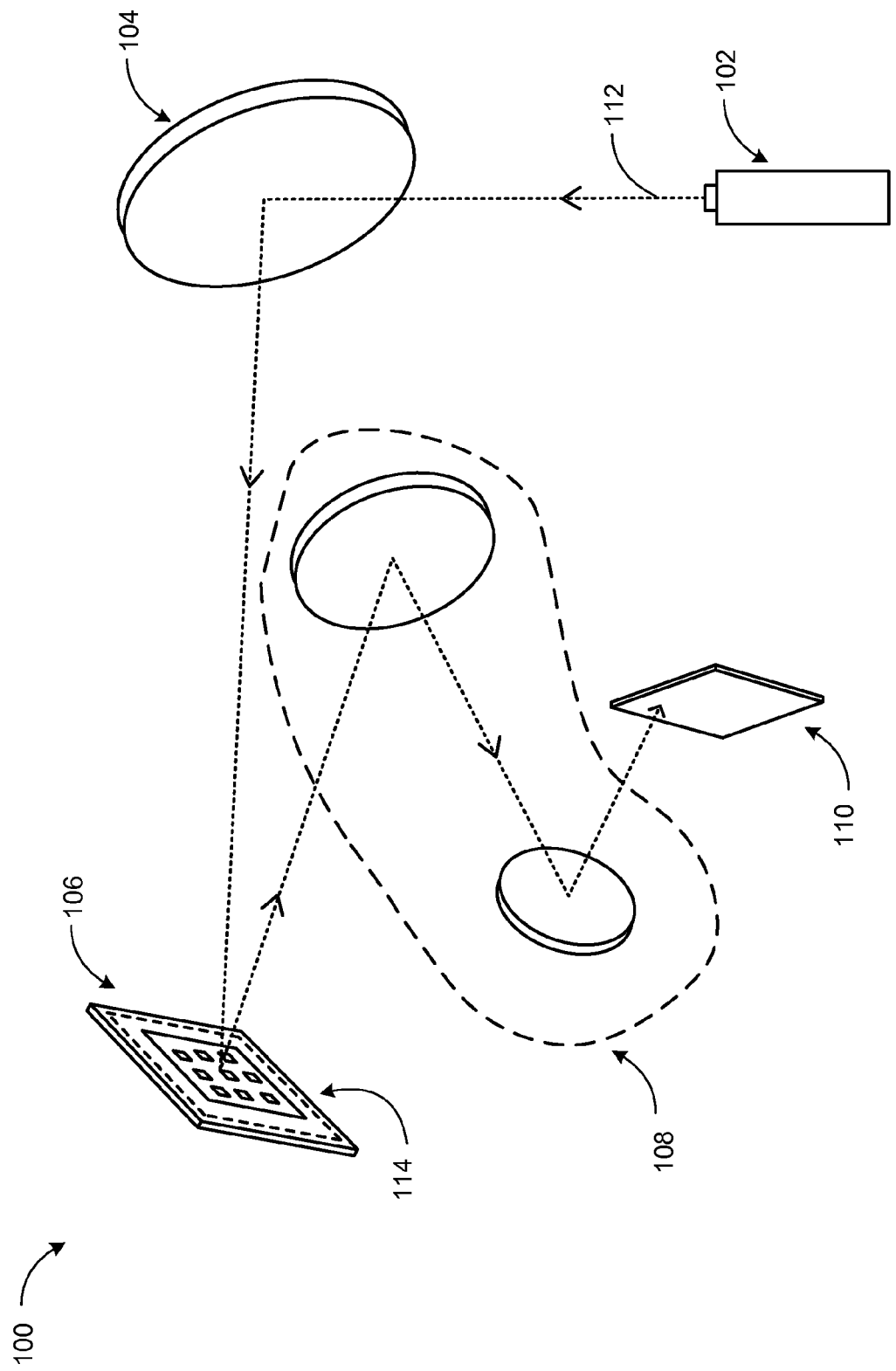
FIG. 1 is an exemplary diagram of an extreme ultraviolet lithography system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the embodiments of the present invention.

In the following description, numerous specific details are given to provide a thorough understanding of the invention. However, it will be apparent that the invention may be practiced without these specific details. In order to avoid obscuring the embodiments of the present invention, some well-known elements, system configurations, and process phases are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features will be described with the same or similar reference numerals.

For expository purposes, the term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

The term "processing" as used herein includes deposition of material or photoresist, patterning, exposure, development, etching, sputtering, cleaning, implantation, and/or removal of the material or photoresist as required in forming a described structure. The terms "about" and "approximately" indicate that the size of an element can be determined within engineering tolerances.

Referring now to FIG. 1, therein is shown an exemplary diagram of an extreme ultraviolet lithography system 100 in a first embodiment of the present invention. The extreme ultraviolet lithography system 100 can include an extreme ultraviolet light source 102 for producing extreme ultraviolet light 112, a set of reflective elements, and a target wafer 110. The reflective components can include a condenser 104, a reflective mask 106, an optical reduction assembly 108, a mask blank, a mirror, or a combination thereof.

The extreme ultraviolet light source 102 can generate the extreme ultraviolet light 112. The extreme ultraviolet light 112 is electromagnetic radiation having a wavelength in the range of 5 to 50 nanometers. For example, the extreme ultraviolet light source 102 can include a laser, a laser produced plasma, a discharge produced plasma, a free-electron laser, synchrotron radiation, or a combination thereof.

The extreme ultraviolet light source 102 can generate the extreme ultraviolet light 112 having a variety of characteristics. The extreme ultraviolet light source 102 can produce broadband extreme ultraviolet radiation over a range of wavelengths. For example, the extreme ultraviolet light source 102 can generate the extreme ultraviolet light 112 having wavelengths ranging from 5 to 50 nm.

The extreme ultraviolet light source 102 can produce the extreme ultraviolet light 112 having a narrow bandwidth. For example, the extreme ultraviolet light source 102 can generate the extreme ultraviolet light 112 at 13.5 nm. The center of the wavelength peak is 13.5 nm.

The condenser 104 is an optical unit for reflecting and focusing the extreme ultraviolet light 112. The condenser 104 can reflect and concentrate the extreme ultraviolet light 112 from the extreme ultraviolet light source 102 to illuminate the reflective mask 106.

Although the condenser 104 is shown as a single element, it is understood that the condenser 104 can include one or more reflective elements such as concave mirrors, convex mirrors, flat mirrors, or a combination thereof, for reflecting and concentrating the extreme ultraviolet light 112. For example, the condenser 104 can be a single concave mirror or an optical assembly having convex, concave, and flat optical elements.

The reflective mask 106 is an extreme ultraviolet reflective element having a mask pattern 114. The reflective mask 106 creates a lithographic pattern to form a circuitry layout to be formed on the target wafer 110. The reflective mask 106 can reflect the extreme ultraviolet light 112.

The optical reduction assembly 108 is an optical unit for reducing the image of the mask pattern 114. The reflection of the extreme ultraviolet light 112 from the reflective mask 106 can be reduced by the optical reduction assembly 108 and reflected on to the target wafer 110. The optical reduction assembly 108 can include mirrors and other optical elements to reduce the size of the image of the mask pattern 114. For example, the optical reduction assembly 108 can include concave mirrors for reflecting and focusing the extreme ultraviolet light 112.

The optical reduction assembly 108 can reduce the size of the image of the mask pattern 114 on the target wafer 110. For example, the mask pattern 114 can be imaged at a 4:1 ratio by the optical reduction assembly 108 on the target wafer 110 to form the circuitry represented by the mask pattern 114 on the target wafer 110. The extreme ultraviolet light 112 can scan the reflective mask 106 synchronously with the target wafer 110 to form the mask pattern 114 on the target wafer 110.

Figure 2:
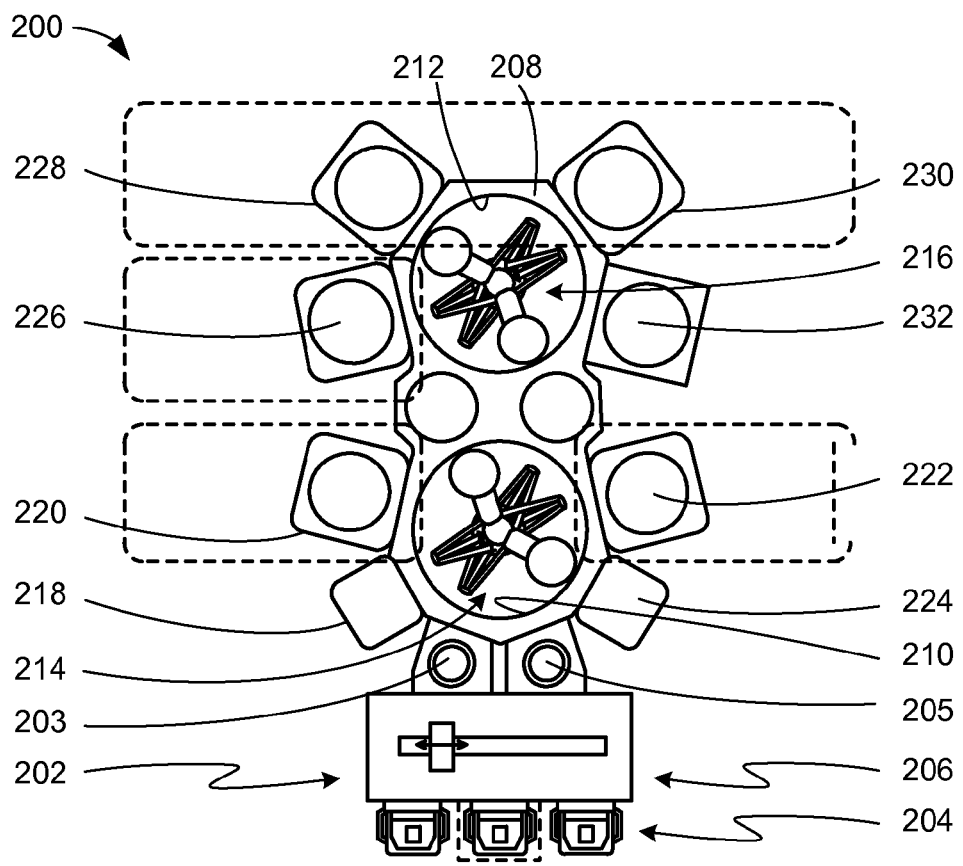
FIG. 2 is an example of an extreme ultraviolet reflective element production system.

Referring now to FIG. 2, therein is shown an example of an extreme ultraviolet reflective element production system 200. The extreme ultraviolet reflective element can reflect extreme ultraviolet light. The extreme ultraviolet reflective element can include a mask blank 204, an extreme ultraviolet (EUV) mirror 205, or other reflective elements.

The extreme ultraviolet reflective element production system 200 can produce mask blanks, mirrors, or other elements that reflect the extreme ultraviolet light 112 of FIG. 1. The extreme ultraviolet reflective element production system 200 can fabricate the extreme ultraviolet reflective elements applying thin coatings to source substrates 203.

The mask blank 204 is a multilayered structure for forming the reflective mask 106 of FIG. 1. The mask blank 204 can be formed using semiconductor fabrication techniques. The reflective mask 106 can have the mask pattern 114 of FIG. 1 formed on the mask blank 204 for representing electronic circuitry.

The extreme ultraviolet mirror 205 is a multilayered structure reflective in the range of extreme ultraviolet light. The extreme ultraviolet mirror 205 can be formed using semiconductor fabrication techniques. The mask blank 204 and the extreme ultraviolet mirror 205 can be similar structures, however the extreme ultraviolet mirror 205 does not have the mask pattern 114.

The extreme ultraviolet reflective elements are efficient reflectors of the extreme ultraviolet light 112. The mask blank 204 and the extreme ultraviolet mirror 205 can have an extreme ultraviolet reflectivity of greater than 60%. The extreme ultraviolet reflective elements are efficient if they reflect more than 60% of the extreme ultraviolet light 112.

The extreme ultraviolet reflective element production system 200 includes a wafer loading and carrier handling system 202 into which the source substrates 203 are loaded and from which the extreme ultraviolet reflective elements are unloaded. An atmospheric handling system 206 provides access to a wafer handling vacuum chamber 208. The wafer loading and carrier handling system 202 can include substrate transport boxes, loadlocks, and other components to transfer a substrate from atmosphere to vacuum inside the system. Because the mask blank 204 is used to form devices at a very small scale, the mask blank 204 must be processed in a vacuum system to prevent contamination and other defects.

The wafer handling vacuum chamber 208 can contain two vacuum chambers, a first vacuum chamber 210 and a second vacuum chamber 212. The first vacuum chamber 210 can include a first wafer handling system 214 and the second vacuum chamber 212 can include a second wafer handling system 216. Although the wafer handling vacuum chamber 208 is described with two vacuum chambers, it is understood that the system can have any number of vacuum chambers.

The wafer handling vacuum chamber 208 can have a plurality of ports around its periphery for attachment of various other systems. The first vacuum chamber 210 can have a degas system 218, a first physical vapor deposition system 220, a second physical vapor deposition system 222, and a pre-clean system 224. The degas system 218 is for thermally desorbing moisture from the substrates. The pre-clean system 224 is for cleaning the surfaces of the wafers, mask blanks, mirrors, or other optical components.

The physical vapor deposition systems, such as the first physical vapor deposition system 220 and the second physical vapor deposition system 222, can be used to form thin films of materials on the source substrates 203. For example, the physical vapor deposition systems can include vacuum deposition system such as magnetron sputtering systems, ion sputtering systems, pulsed laser deposition, cathode arc deposition, or a combination thereof. The physical vapor deposition systems, such as the magnetron sputtering system, can form thin layers on the source substrates 203 including the layers of silicon, metals, alloys, compounds, or a combination thereof.

The physical vapor deposition system can form reflective layers, capping layers, and absorber layers. For example, the physical vapor deposition systems can form layers of silicon, molybdenum, ruthenium, niobium, chromium, tantalum, nitrides, carbon, compounds, or a combination thereof. Although some compounds are described as an oxide, it is understood that the compounds can include oxides, dioxides, atomic mixtures having oxygen atoms, or a combination thereof.

The second vacuum chamber 212 can have a first multi-cathode source 226, a chemical vapor deposition system 228, a cure chamber 230, and an ultra-smooth deposition chamber 232 connected to it. For example, the chemical vapor deposition system 228 can include a flowable chemical vapor deposition system (FCVD), a plasma assisted chemical vapor deposition system (CVD), an aerosol assisted CVD, a hot filament CVD system, or a similar system. In another example, the chemical vapor deposition system 228, the cure chamber 230, and the ultra-smooth deposition chamber 232 can be in a separate system from the extreme ultraviolet reflective element production system 200.

The chemical vapor deposition system 228 can form thin films of material on the source substrates 203. For example, the chemical vapor deposition system 228 can be used to form layers of materials on the source substrates 203 including mono-crystalline layers, polycrystalline layers, amorphous layers, epitaxial layers, or a combination thereof. The chemical vapor deposition system 228 can form layers of silicon, silicon oxides, carbon, tungsten, silicon carbide, silicon nitride, titanium nitride, metals, alloys, and other materials suitable for chemical vapor deposition. For example, the chemical vapor deposition system can form planarization layers.

The first wafer handling system 214 is capable of moving the source substrates 203 between the atmospheric handling system 206 and the various systems around the periphery of the first vacuum chamber 210 in a continuous vacuum. The second wafer handling system 216 is capable of moving the source substrates 203 around the second vacuum chamber 212 while maintaining the source substrates 203 in a continuous vacuum. The extreme ultraviolet reflective element production system 200 can transfer the source substrates 203 and the mask blank 204 between the first wafer handling system 214, the second wafer handling system 216 in continuous vacuum conditions.

Figure 3:
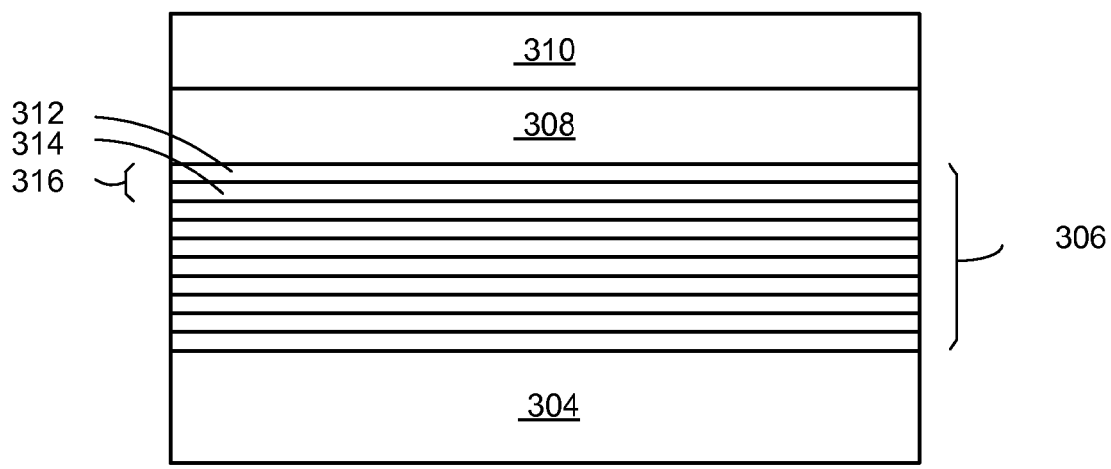
FIG. 3 is an example of an extreme ultraviolet reflective element.

Referring now to FIG. 3, therein is shown an example of an extreme ultraviolet reflective element 302. The extreme ultraviolet reflective element 302 can be the mask blank 204 of FIG. 2 or the extreme ultraviolet mirror 205 of FIG. 2. The mask blank 204 and the extreme ultraviolet mirror 205 are structures for reflecting the extreme ultraviolet light 112 of FIG. 1.

The extreme ultraviolet reflective element 302, such as the extreme ultraviolet mirror 205, can include a substrate 304, a multilayer stack 306, and a capping layer 308. The extreme ultraviolet mirror 205 can be used to form reflecting structures for use in the condenser 104 of FIG. 1 or the optical reduction assembly 108 of FIG. 1.

The mask blank 204 can include the substrate 304, the multilayer stack 306, the capping layer 308, and an absorber layer 310. The mask blank 204 can be used to form the reflective mask 106 of FIG. 1 by patterning the absorber layer 310 with the layout of the circuitry required.

In the following sections, the term for the mask blank 204 can be used interchangeably with the term of the extreme ultraviolet mirror 205 for simplicity. The mask blank 204 can include the components of the extreme ultraviolet mirror 205 with the absorber layer 310 added in addition to form the mask pattern 114 of FIG. 1.

The mask blank 204 is an optically flat structure used for forming the reflective mask 106 having the mask pattern 114. For example, the reflective surface of the mask blank 204 can form a flat focal plane for reflecting the incident light, such as the extreme ultraviolet light 112 of FIG. 1.

The substrate 304 is an element for providing structural support to the extreme ultraviolet reflective element 302. The substrate 304 can be made from a material having a low coefficient of thermal expansion (CTE) to provide stability during temperature changes. The substrate 304 can have properties such as stability against mechanical cycling, thermal cycling, crystal formation, or a combination thereof. The substrate 304 can be formed from a material such as silicon, glass, oxides, ceramics, glass ceramics, or a combination thereof.

The multilayer stack 306 is a structure that is reflective to the extreme ultraviolet light 112. The multilayer stack 306 includes alternating reflective layers of a first reflective layer 312 and a second reflective layer 314.

The first reflective layer 312 and the second reflective layer 314 can form a reflective pair 316. The multilayer stack 306 can include between 40-60 of the reflective pairs 316 for a total of up to 120 reflective layers. However, it is understood that more or fewer layers can be used as needed.

The first reflective layer 312 and the second reflective layer 314 can be formed from a variety of materials. For example, the first reflective layer 312 and the second reflective layer 314 can be formed from silicon and niobium, respectively. The optical properties of niobium determine how well it performs in the multilayer stack. The real and imaginary components of the refractive index are similar to molybdenum. The first reflective layer 312 can be formed from silicon. The second reflective layer 314 can be formed from niobium.

Although the multilayer stack 306 is described as having the first reflective layer 312 formed from silicon and the second reflective layer 314 formed from niobium, other configurations are possible. For example, the first reflective layer 312 can be formed from niobium and the second reflective layer 314 can be formed from silicon.

However, it is understood that the alternating layers can be formed from other materials. In another example, the second reflective layer 314 can be formed with niobium carbide.

The reflectivity of the mask blank 204 and the extreme ultraviolet mirror 205 is determined by the sharpness of the interface between the layers and the roughness of layers. Changing the material used to from the multilayer stack 306 can improve interface sharpness or layer roughness will increase the multilayer reflectivity.

The multilayer stack 306 forms a reflective structure by having alternating thin layers of materials with different optical properties to create a Bragg mirror. Each of the alternating layers can have dissimilar optical constants for the extreme ultraviolet light 112.

The multilayer stack 306 can be formed in a variety of ways. For example, the first reflective layer 312 and the second reflective layer 314 can be formed with magnetron sputtering, ion sputtering systems, pulsed laser deposition, cathode arc deposition, or a layer deposition technique.

In an illustrative example, the multilayer stack 306 can be formed using a physical vapor deposition technique, such as magnetron sputtering. The first reflective layer 312 and the second reflective layer 314 of the multilayer stack 306 can have the characteristics of being formed by the magnetron sputtering technique including precise thickness, low roughness, and clean interfaces between the layers. The first reflective layer 312 and the second reflective layer 314 of the multilayer stack 306 can have the characteristics of being formed by the physical vapor deposition including precise thickness, low roughness, and clean interfaces between the layers.

The physical dimensions of the layers of the multilayer stack 306 formed using the physical vapor deposition technique can be precisely controlled to increase reflectivity. For example, the first reflective layer 312, such as a layer of silicon, can have a thickness of 3.5 nm. The second reflective layer 314, such as a layer of niobium, can have a thickness of 3.5 nm. However, it is understood that the thickness of the first reflective layer 312 and the second reflective layer 314 can vary based on engineering needs, the wavelength of the extreme ultraviolet light 112, and the optical properties of the layer materials. In another example, the second reflective layer 314 can be formed with niobium carbide having a thickness of 3.5 nm.

In another example, the first reflective layer 312 and the second reflective layer 314 can be formed from silicon and niobium carbide. The first reflective layer, such as a silicon layer, can have a thickness of 4.15 nm. The second reflective layer 314, such as a layer of niobium carbide, can have a thickness of 2.8 nm It has been discovered that forming the multilayer stack 306 with silicon and niobium provides similar reflectivity of the multilayer stack 306 as silicon and molybdenum. Based on the refractive index and other physical properties of niobium and silicon, the multilayer stack 306 having reflectivity comparable to that of molybdenum and silicon.

It has been discovered that forming the multilayer stack 306 with silicon and niobium carbide provides similar reflectivity of the multilayer stack 306 as silicon and molybdenum. Based on the refractive index and other physical properties of niobium carbide and silicon, the multilayer stack 306 having a silicon layer of 4.15 nm and a niobium carbide layer of 2.8 nm provides a reflectivity comparable to that of molybdenum and silicon.

It has been discovered that forming the multilayer stack 306 with niobium carbide increases the reliability of the multilayer stack 306. The hardness of the niobium carbide protects the multilayer stack 306 and increase operating life.

The capping layer 308 is a protective layer transparent to the extreme ultraviolet light 112. The capping layer 308 can be formed directly on the multilayer stack 306. The capping layer 308 can protect the multilayer stack 306 from contaminants and mechanical damage. For example, the multilayer stack 306 can be sensitive to contamination by oxygen, carbon, hydrocarbons, or a combination thereof. The capping layer 308 can interact with the contaminants to neutralize them.

The capping layer 308 is an optically uniform structure that is transparent to the extreme ultraviolet light 112. The extreme ultraviolet light 112 can pass through the capping layer 308 to reflect off of the multilayer stack 306.

The capping layer 308 has a smooth surface. For example, the surface of the capping layer 308 can have a roughness of less than 0.2 nm RMS (root mean square roughness measure). In another example, the surface of the capping layer 308 can have a roughness of 0.08 nm RMS with a characteristic surface roughness length between $1/100$ nm and $1/1$ µm.

The capping layer 308 can be formed in a variety of ways. For example, the capping layer 308 can be formed directly on the multilayer stack 306 with magnetron sputtering, ion sputtering systems, ion beam deposition, electron beam evaporation, radio frequency (RF) sputtering, atomic layer deposition (ALD), pulsed laser deposition, cathode arc deposition, physical vapor deposition, or a combination thereof. The capping layer 308 can have the physical characteristics of being formed by the magnetron sputtering technique including precise thickness, low roughness, and clean interfaces between the layers.

One of the causes of reflectivity loss is oxidation of the multilayer stack 306 due to the periodic cleaning process. To prevent this oxidation the capping layer 308 can be formed directly on the top of the multilayer stack 306 before the absorber layer 310 is formed.

Because most materials are opaque to the extreme ultraviolet light 112, the general contamination level in the extreme ultraviolet system must be minimized. Thus, the reflective mask 106 must be cleaned with greater frequency than with other lithographic systems. In order to remove the small particles and other contaminants commonly found on the reflective mask 106 during use, the cleaning procedure needs to be aggressive. However, the harsh cleaning procedure, such as the Megasonic process, can causes pitting and degradation of the capping layer 308, which can lead to reflectivity loss and oxidation of the multilayer stack 306.

The capping layer 308 can be formed from a variety of materials having a hardness sufficient to resist erosion during cleaning. For example, ruthenium can be used as a capping layer material because it is a good etch stop and is relatively inert under the operating conditions. However, it is understood that other materials can be used to form the capping layer 308. The capping layer 308 can have a thickness of between 2 nm to 3 nm. In another example, a typically capping layer thickness can be 2.5 nm for ruthenium.

It has been discovered that forming the capping layer 308 with niobium carbide increases the reliability of the extreme ultraviolet reflective element 302 by protecting the multilayer stack 306. The hardness of the niobium carbide protects the multilayer stack 306 and increase operating life by reducing erosion and oxidation of the multilayer stack 306.

It has been discovered that forming the capping layer 308 with an additional layer of niobium carbide increases the reliability of the extreme ultraviolet reflective element 302 by protecting the multilayer stack 306. The hardness of the niobium carbide protects the multilayer stack 306 and increase operating life by reducing erosion and oxidation of the multilayer stack 306.

After cleaning, the capping layer 308 can have the physical characteristics of being exposed to a cleaning process. The capping layer 308 can have physical characteristics of erosion marks, reduced thickness, uneven wear, solvent residue, residue from the absorber layer 310, or a combination thereof. The capping layer 308 can exhibit additional physical characteristics including chemical residue caused by the interaction of the cleaning solvents and the material of the capping layer 308.

The extreme ultraviolet reflective element 302, such as the extreme ultraviolet mirror 205, can be formed with the substrate 304, the multilayer stack 306, and the capping layer 308. The extreme ultraviolet mirror 205 has an optically flat surface and can efficiently and uniformly reflect the extreme ultraviolet light 112.

Protecting the multilayer stack 306 with the capping layer 308 prevents degradation of the reflectivity. The capping layer 308 can prevent damage to the multilayer stack 306 during manufacturing and cleaning operations. The capping layer 308 can prevent oxidation to maintain reflectivity and prevent reflectivity loss of the multilayer stack 306 during use and cleaning.

For example, the multilayer stack 306 can have a reflectivity of greater than 60%. The multilayer stack 306 formed using physical vapor deposition can have reflectivity between than 63%-68%. Forming the capping layer 308 over the multilayer stack 306 with harder materials can reduce reflectivity by 1%-2%, but the capping layer 308 prevents damage to the multilayer stack 306 and prevents a reduction in the reflectivity of the multilayer stack 306. In some cases, reflectivity up to 70% can be achieved using low roughness layers, clean interfaces between layers, improved layer materials, or a combination thereof.

The absorber layer 310 is a layer that can absorb the extreme ultraviolet light 112. The absorber layer 310 can be used to form the pattern on the reflective mask 106 by providing areas that do not reflect the extreme ultraviolet light 112. The absorber layer 310 can be a material having a high absorption coefficient for a particular frequency of the extreme ultraviolet light 112, such as about 13.5 nm. In an illustrative example, the absorber layer 310 can be formed from chromium, tantalum, nitrides, nickel, alloys, or a combination thereof. In another example, the absorber layer can be formed from an alloy of tantalum, boron, and nitrogen in various ratios.

The absorber layer 310 can be formed directly on the capping layer 308. The absorber layer 310 can be etched using a photolithography process to form the pattern of the reflective mask 106.

The extreme ultraviolet reflective element 302, such as the mask blank 204, can be formed with the substrate 304, the multilayer stack 306, the capping layer 308, and the absorber layer 310. The mask blank 204 has an optically flat surface and can efficiently and uniformly reflect the extreme ultraviolet light 112. The mask pattern 114 can be formed with the absorber layer 310 of the mask blank 204.

It has been discovered that reflectivity can be increased by adding an interstitial layer of carbon between the top of the multilayer stack 306 and the capping layer 308. It has been discovered the forming a layer of carbon over the multilayer stack 306 increases reflectivity.

It has been discovered that reflectivity can be increased by adding an interstitial layer of carbon or niobium carbide between the top of the multilayer stack 306 and the capping layer 308. It has been discovered the forming a layer of carbon or niobium carbide over the multilayer stack 306 increases reflectivity.

It has been discovered that forming the capping layer 308 with niobium or niobium carbide over the multilayer stack 306 increases reflectivity and operational lifetime. Niobium carbide provides a hard protective layer. Forming the capping layer 308 from niobium or niobium carbide can protect the multilayer stack 306 formed from molybdenum and silicon layers. The capping layer 308 formed from niobium or niobium carbide can be used in addition to or an alternative to forming the capping layer 308 from ruthenium.

The first reflective layer 312, the second reflective layer 314, the capping layer 308, and the absorber layer 310 can be formed with physical vapor deposition systems. The physical vapor deposition systems can include the first physical vapor deposition system 220 of FIG. 2, the second physical vapor deposition system 222 of FIG. 2, or a combination thereof.

Although the extreme ultraviolet reflective element is shown with the substrate 304, the multilayer stack 306, the capping layer 308, and the absorber layer 310, it is understood that other layers may be included. Additional protective layers, passivation layers, or other layers can be included. For example, the extreme ultraviolet reflective element can include a planarization layer below the multilayer stack 306.

Figure 4:
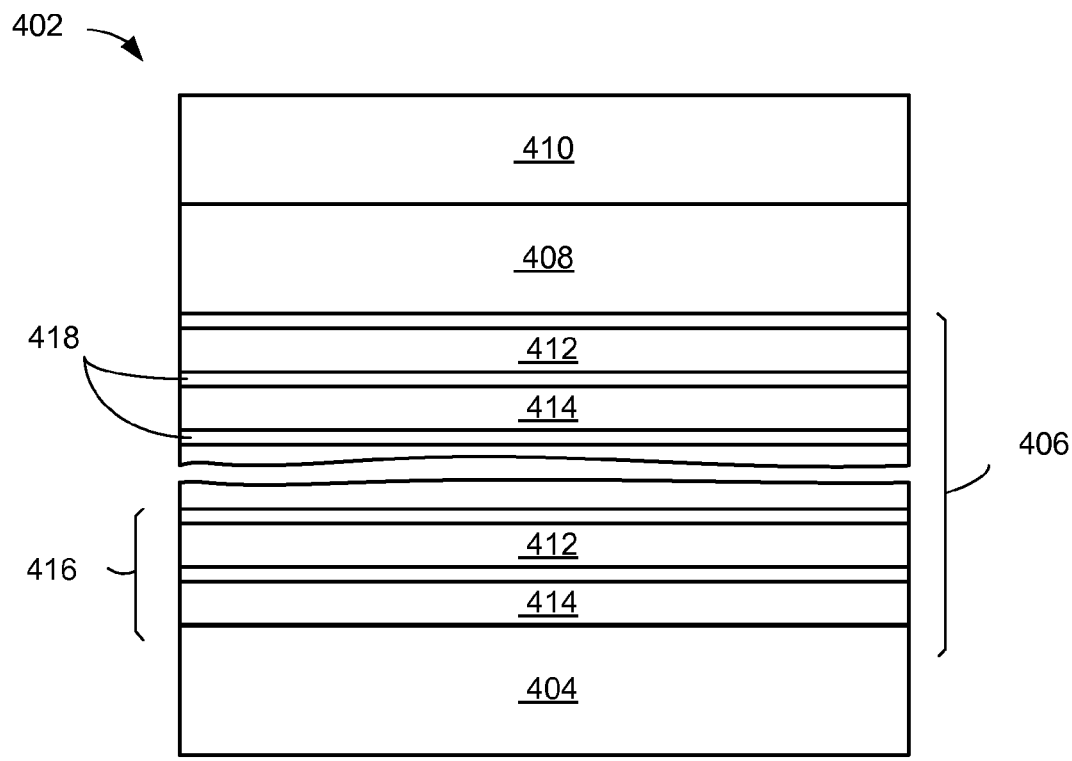
FIG. 4 is a second example of a multilayer stack.

Referring now to FIG. 4, therein is shown a second example of a multilayer stack 406. The multilayer stack 406 is similar to the multilayer stack 306 of FIG. 3 and uses similar element numbers.

The multilayer stack 406 can be part of an extreme ultraviolet reflective element 402, such the mask blank 204 of FIG. 2 or the extreme ultraviolet mirror 205 of FIG. 2. The mask blank 204 and the extreme ultraviolet mirror 205 are structures for reflecting the extreme ultraviolet light 112 of FIG. 1.

The extreme ultraviolet mirror 205 can include a substrate 404, the multilayer stack 406, and a capping layer 408. The mask blank 204 can include the substrate 404, the multilayer stack 406, the capping layer 408, and an absorber layer 410. The mask blank 204 can be used to form the reflective mask 106 of FIG. 1 by patterning the absorber layer 410 with the layout of the circuitry required.

In the following sections, the term for the mask blank 204 can be used interchangeably with the term of the extreme ultraviolet mirror 205 for simplicity. The mask blank 204 can include the components of the extreme ultraviolet mirror 205 with the absorber layer 410 added in addition to form the mask pattern 114 of FIG. 1.

The mask blank 204 is an optically flat structure used for forming the reflective mask 106 having the mask pattern 114. The substrate 404 is a structural element for supporting the extreme ultraviolet reflective element 402.

The absorber layer 410 is a layer that can absorb the extreme ultraviolet light 112. The absorber layer 410 can be used to form the pattern on the reflective mask 106 by providing areas that do not reflect the extreme ultraviolet light 112.

The capping layer 408 is a protective layer transparent to the extreme ultraviolet light 112. The capping layer 408 can be formed directly on the multilayer stack 406. The capping layer 408 can protect the multilayer stack 406 from contaminants and mechanical damage.

The multilayer stack 406 is a structure that is reflective to the extreme ultraviolet light 112. The multilayer stack 406 can include alternating reflective layers of a first reflective layer 412 and a second reflective layer 414 with a barrier layer 418 between each alternating layer. The multilayer stack 406 can optionally include the barrier layer 418 between the first reflective layer 412 and the capping layer 408 and between the second reflective layer 414 and the substrate 404.

The barrier layer 418 is a protective layer. The barrier layer 418 is for separating the first reflective layer 412 and the second reflective layer 414 to minimize the chemical interaction between the layers. For example, the barrier layer 418 can be formed from carbon, niobium carbide, or a material with similar properties.

The first reflective layer 412 and the second reflective layer 414 can form a reflective pair 416. The multilayer stack 406 can include between 40-60 of the reflective pairs 416 for a total of up to 120 reflective layers. However, it is understood that more or fewer layers can be used as needed.

The first reflective layer 412 and the second reflective layer 414 can be formed from a variety of materials. For example, the first reflective layer 412 and the second reflective layer 414 can be formed from silicon and niobium, respectively.

The multilayer stack 406 can have a variety of configurations. For example, the first reflective layer 412 can be formed from silicon and the second reflective layer 414 can be formed from niobium or niobium carbide. In another example, the first reflective layer 412 can be formed from niobium or niobium carbide and the second reflective layer 414 can be formed from silicon.

Although the multilayer stack 406 is described as having the first reflective layer 412 formed from silicon and the second reflective layer 414 formed from niobium, other configurations are possible. For example, the first reflective layer 412 can be formed from niobium and the second reflective layer 414 can be formed from silicon.

However, it is understood that the multilayer stack 406 can be formed from other materials. In another example, the second reflective layer 414 can be formed with niobium carbide. As niobium carbide is has high hardness, the multilayer stack 406 can be fabricated from silicon and molybdenum and covered with a layer of niobium or niobium carbide. This can be used in addition to or an alternative to the capping layer 408 formed from ruthenium.

The reflectivity of the mask blank 204 and the extreme ultraviolet mirror 205 is determined by the sharpness of the interface between the layers and the roughness of layers. Changing the material used to from the multilayer stack 406 can improve interface sharpness or layer roughness and increase the multilayer reflectivity.

Because most materials absorb light at extreme ultraviolet wavelengths, the optical elements used must be reflective instead of the transmissive as used in other lithography systems. The multilayer stack 406 forms a reflective structure by having alternating thin layers of materials with different optical properties to create a Bragg reflector or mirror.

Each of the alternating layers can have dissimilar optical constants for the extreme ultraviolet light 112. The alternating layers cause constructive interference when the period of the thickness of the reflective pair 416 is approximately half the wavelength of the extreme ultraviolet light 112. For example, for the extreme ultraviolet light 112 at a wavelength of 13 nm, the reflective pair 416 can be about 6.5 nm thick.

The multilayer stack 406 can be formed in a variety of ways. For example, the first reflective layer 412, the second reflective layer 414, and the barrier layer 418 can be formed with magnetron sputtering, ion sputtering systems, pulsed laser deposition, cathode arc deposition, or a combination thereof.

In an illustrative example, the multilayer stack 406 can be formed using a physical vapor deposition technique, such as magnetron sputtering. The first reflective layer 412, the second reflective layer 414, and the barrier layer 418 of the multilayer stack 406 can have the characteristics of being formed by the magnetron sputtering technique including precise thickness, low roughness, and clean interfaces between the layers.

The physical dimensions of the layers of the multilayer stack 406 formed using the physical vapor deposition technique can be precisely controlled to increase reflectivity. For example, the first reflective layer 412, such as a layer of silicon, can have a thickness of 3.5 nm. The second reflective layer 414, such as a layer of niobium, can have a thickness of 3.5 nm. The barrier layer 418, such as a layer of carbon, can have a thickness of between 1 and 5 angstroms. However, it is understood that the thickness of the first reflective layer 412 and the second reflective layer 414 can vary based on engineering needs, the wavelength of the extreme ultraviolet light 112, and the optical properties of the layer materials.

Protecting the multilayer stack 406 with the capping layer 408 improves reflectivity. The capping layer 408 can prevent damage to the multilayer stack 406 during manufacturing and cleaning operations. The capping layer 408 can be mounted directly on the multilayer stack 406 or directly on the barrier layer 418.

For example, the multilayer stack 406 can have a reflectivity of greater than 60%. The multilayer stack 406 formed using physical vapor deposition can have reflectivity between than 63%-68%. Forming the capping layer 408 over the multilayer stack 406 formed with harder materials can improve reflectivity. In some cases, reflectivity up to 70% can be achieved using low roughness layers, clean interfaces between layers, improved layer materials, or a combination thereof.

It has been discovered that forming the multilayer stack 406 with the barrier layer 418 formed from carbon or niobium carbide increases reflectivity and increases reliability. The barrier layer 418 can reduce the formation of silicides and form smoother layers.

Figure 5:
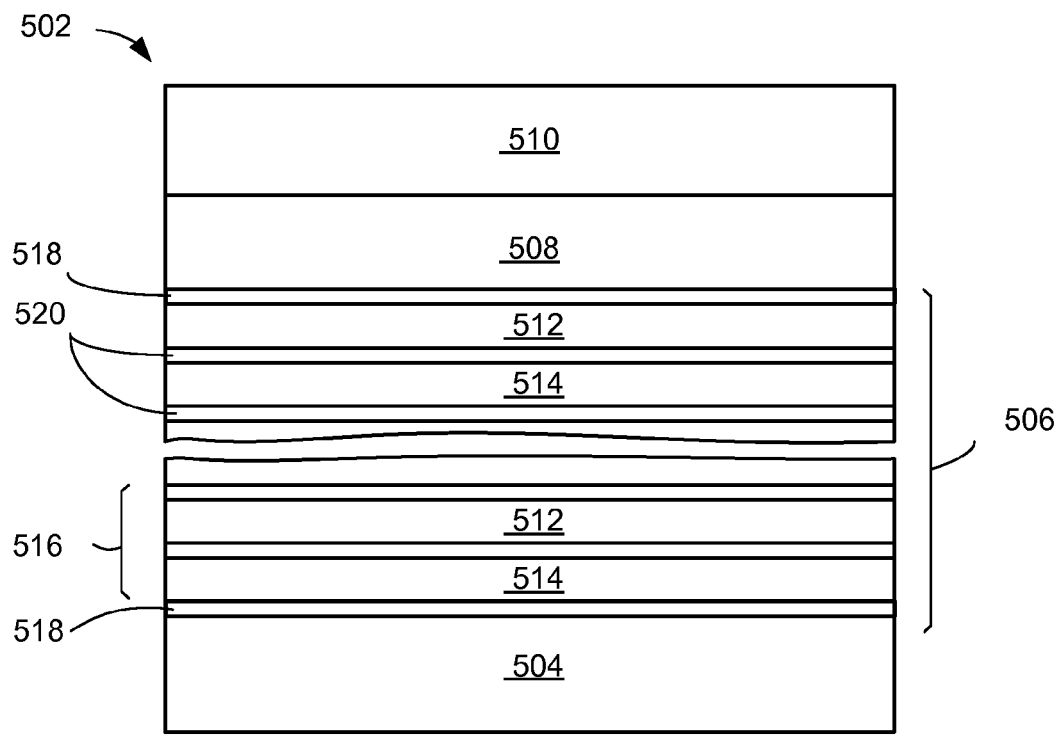
FIG. 5 is a third example of a multilayer stack.

Referring now to FIG. 5, therein is shown a third example of a multilayer stack 506. The multilayer stack 506 is similar to the multilayer stack 306 of FIG. 3 and uses similar element numbers.

The multilayer stack 506 can be part of an extreme ultraviolet reflective element 502, such the mask blank 204 of FIG. 2 or the extreme ultraviolet mirror 205 of FIG. 2. The mask blank 204 and the extreme ultraviolet mirror 205 are structures for reflecting the extreme ultraviolet light 112 of FIG. 1.

The multilayer stack 506 can include a substrate 504, the multilayer stack 506, a capping layer 508, and an absorber layer 510. The multilayer stack 506 can include a first reflective layer 512 and a second reflective layer 514 forming a reflective pair 516.

Although the multilayer stack 506 can have the first reflective layer 512 formed from silicon and the second reflective layer 514 formed from niobium, other configurations are possible. For example, the first reflective layer 512 can be formed from niobium or niobium carbide and the second reflective layer 514 can be formed from silicon.

The multilayer stack 506 is a structure that is reflective to the extreme ultraviolet light 112. The multilayer stack 506 can include alternating reflective layers of the first reflective layer 512 and the second reflective layer 514 with a boundary layer 520 between each alternating layer. The multilayer stack 506 can optionally include the boundary layer 520 between the first reflective layer 512 and the capping layer 508 and between the second reflective layer 514 and the substrate 504.

The boundary layer 520 is a layer between the first reflective layer 512 and the second reflective layer 514. The boundary layer 520 is the result of a chemical reaction between the material of the first reflective layer 512 and the second reflective layer 514. For example, the boundary layer 520 can be a silicide. The silicide can be formed from silicon and a metal such as niobium.

The multilayer stack 506 can include a barrier layer 518. The barrier layer 518 is a protective layer. For example, the barrier layer 518 can be formed from carbon having a thickness of between 1 and 5 angstroms inclusive. The barrier layer 518 can be formed between the multilayer stack 506 and the capping layer 508. Another of the barrier layer 518 can be formed between the multilayer stack 506 and the substrate 504.

The barrier layer 518 can be formed between the first reflective layer 512 and the second reflective layer 514 to modify the boundary layer 520. The barrier layer 518 can reduce the thickness of the boundary layer 520 by inhibiting the formation of the silicide.

Referring now to FIG. 6, therein is shown the structure of FIG. 3 in a provisioning phase of manufacturing. The provisioning phase can include a method to provide the substrate 304. For example, the provisioning phase can provide the substrate 304 formed from silicon.

Referring now to FIG. 7, therein is shown the structure of FIG. 6 in a layering phase of manufacturing. The layering phase can include a method to form the multilayer stack 306 directly on the substrate 304. The multilayer stack 306 can form alternating layers of the first reflective layer 312 and the second reflective layer 314 on the substrate 304. For example, the multilayer stack 306 can have between 40 and 80 alternating layers of niobium and silicon.

Referring now to FIG. 8, therein is shown the structure of FIG. 7 in a protective phase of manufacturing. The protective phase can include a method to form the capping layer 308 on the multilayer stack 306. The multilayer stack 306 can include alternating layers of the first reflective layer 312 and the second reflective layer 314 on the substrate 304. For example, the protective phase can use magnetron sputtering to deposit a metallic material on the multilayer stack 306.

Referring now to FIG. 9, therein is shown the structure of FIG. 8 in a pre-patterning phase of manufacturing. The pre-patterning phase can include a method to form the absorber layer 310 directly on the capping layer 308. For example, the pre-patterning phase can form the absorber layer 310 on the capping layer 308.

The capping layer 308 is over the multilayer stack 306. The multilayer stack 306 can include alternating layers of the first reflective layer 312 and the second reflective layer 314 on the substrate 304.

Figure 10:
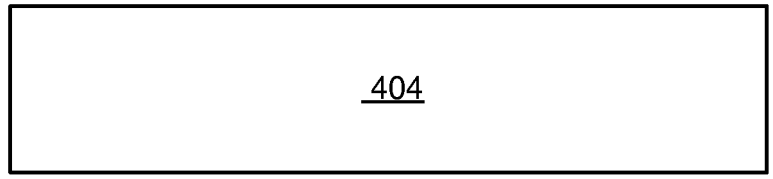
FIG. 10 is the structure of FIG. 4 in a provisioning phase of manufacturing.

Referring now to FIG. 10, therein is shown the structure of FIG. 4 in a provisioning phase of manufacturing. The provisioning phase can include a method to provide the substrate 404. For example, the provisioning phase can provide the substrate 404 formed from an ultra-low thermal expansion material. In another example, the substrate 404 can be formed from silicon, glass, or a combination thereof.

Figure 11:
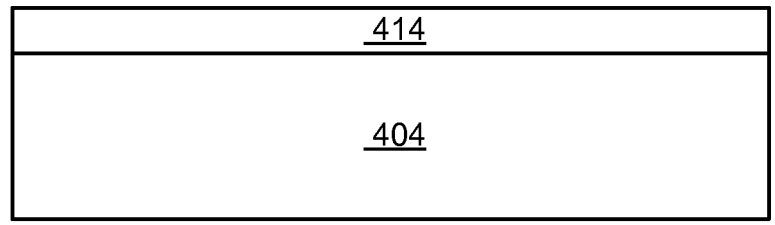
FIG. 11 is the structure of FIG. 10 in a layering phase of manufacturing.

Referring now to FIG. 11, therein is shown the structure of FIG. 10 in a layering phase of manufacturing. The layering phase can include a method to form the second reflective layer 414 on the substrate 404.

Figure 12:
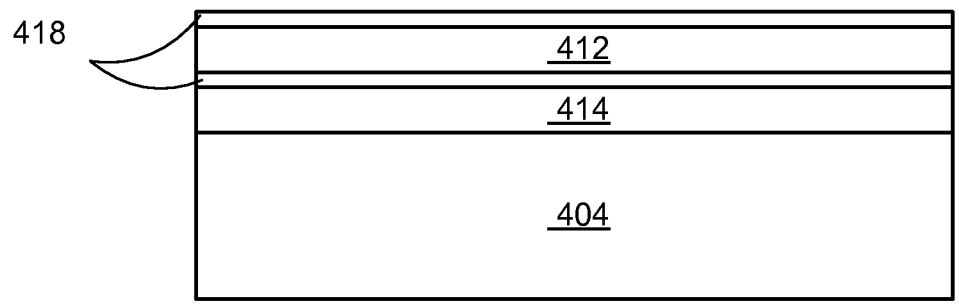
FIG. 12 is the structure of FIG. 11 in a depositing phase of manufacturing.

Referring now to FIG. 12, therein is shown the structure of FIG. 11 in a depositing phase of manufacturing. The depositing phase can include a method to form the first reflective layer 412 and the barrier layer 418 on the second reflective layer 414.

The layering phase and the depositing phase can be repeated as many times as needed to finish forming the reflective pairs 416 of FIG. 4 of the multilayer stack 406 of FIG. 4 on the substrate 404. For example, the multilayer stack 406 can have between 40-60 alternating layers of silicon and niobium with a carbon layer between them. The multilayer stack 406 can be formed on the substrate 404.

Figure 13:
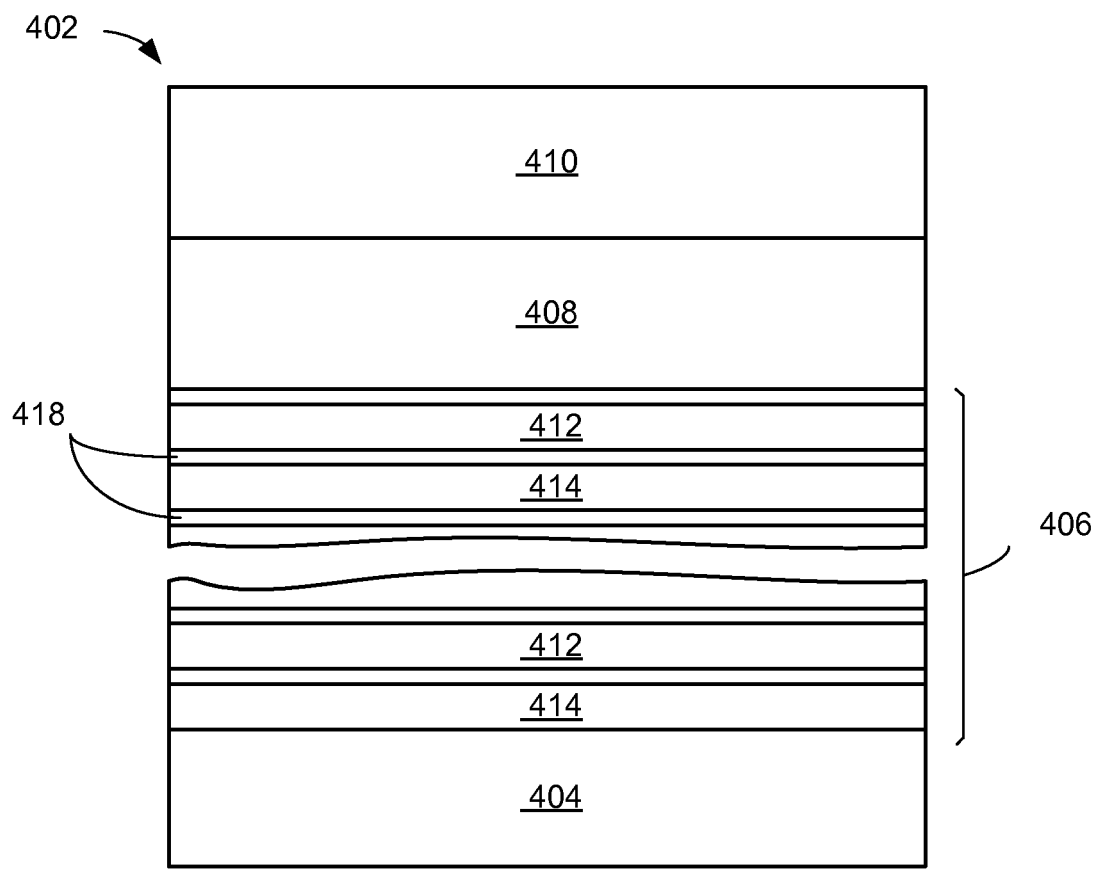
FIG. 13 is the structure of FIG. 12 in a finishing phase of manufacturing.

Referring now to FIG. 13, therein is shown the structure of FIG. 12 in a finishing phase of manufacturing. The finishing phase can include a method to form the capping layer 408 on the multilayer stack 406 and the absorber layer 410 directly on the capping layer 408. The multilayer stack 406 can include the first reflective layer 412 and the second reflective layer 414 with the barrier layer 418 between the layers.

Figure 14:
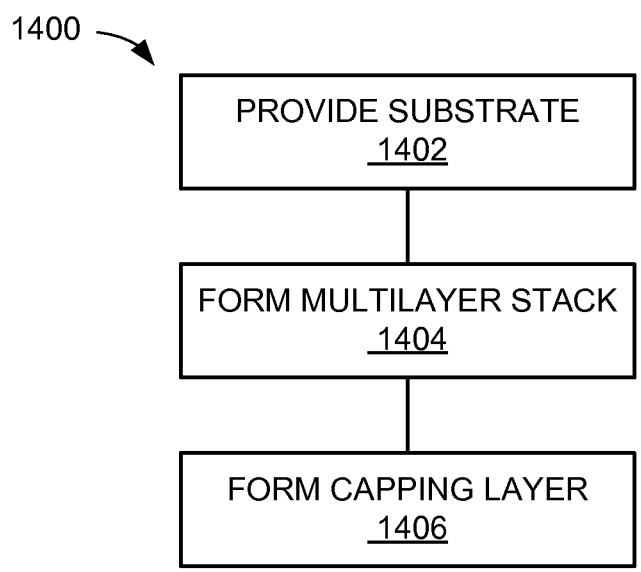
FIG. 14 is a flow chart of a method of manufacture of the extreme ultraviolet reflective element in a further embodiment of the present invention.

Referring now to FIG. 14, therein is shown a flow chart of a method 1400 of manufacture of an extreme ultraviolet reflective element in a further embodiment of the present invention. The method 1400 includes: providing a substrate in a block 1402; forming a multilayer stack on the substrate, the multilayer stack includes a plurality of reflective layer pairs having a first reflective layer formed from silicon and a second reflective layer formed from niobium or niobium carbide for forming a Bragg reflector in a block 1404; and forming a capping layer on and over the multilayer stack for protecting the multilayer stack by reducing oxidation and mechanical erosion in a block 1406.

Thus, it has been discovered that the extreme ultraviolet reflective element production system of the embodiments of the present invention furnishes important and heretofore unknown and unavailable solutions, capabilities, and functional aspects for an extreme ultraviolet reflective element production system. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing extreme ultraviolet reflective element production systems fully compatible with conventional manufacturing methods or processes and technologies.

Another important aspect of the embodiments of the present invention is that they valuably supports and services the historical trend of reducing costs, simplifying manufacturing, and increasing performance. These and other valuable aspects of the embodiments of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture for an extreme ultraviolet reflective element comprising:
   providing a substrate;
   forming a multilayer stack on the substrate, the multilayer stack includes a plurality of reflective layer pairs having a first reflective layer formed from silicon and a second reflective layer formed from niobium or niobium carbide for forming a Bragg reflector; and
   forming a capping layer on and over the multilayer stack for protecting the multilayer stack by reducing oxidation and mechanical erosion.

2. The method as claimed in claim 1, wherein forming the multilayer stack includes forming the first reflective layer from silicon having a thickness from 3.5 to 4.15 nanometers and the second reflective layer formed from niobium 3.5 nanometers thick or niobium carbide 2.8 nanometers thick.

3. The method as claimed in claim 1, wherein forming the multilayer stack includes forming a barrier layer between the first reflective layer and the second reflective layer, the barrier layer formed from carbon having a thickness between 1 angstrom and 5 angstroms, and the barrier layer for reducing the formation of silicide.

4. The method as claimed in claim 1, wherein forming the multilayer stack includes forming a barrier layer between the multilayer stack and the capping layer, the barrier layer formed from carbon having a thickness between 1 angstrom and 5 angstroms for reducing the formation of silicide.

5. The method as claimed in claim 1, wherein forming the multilayer stack includes forming a barrier layer between the multilayer stack and the substrate, the barrier layer formed from carbon having a thickness between 1 angstrom and 5 angstroms for reducing the formation of silicide.

6. The method as claimed in claim 1, wherein forming the multilayer stack includes:
   forming a barrier layer between the first reflective layer and the second reflective layer, the barrier layer formed from carbon having a thickness of 5 angstroms; and
   forming a boundary layer of silicide between the first reflective layer and the second reflective layer, the boundary layer having a reduced thickness based on the barrier layer.

7. The method as claimed in claim 1, wherein forming the capping layer includes forming the capping layer from ruthenium or a ruthenium alloy and forming an absorber layer on and over the capping layer, the absorber layer formed from chromium, tantalum, nitrides, nickel, or a combination thereof.

8. An extreme ultraviolet reflective element comprising:
   a substrate;
   a multilayer stack on the substrate, the multilayer stack includes a plurality of reflective layer pairs having a first reflective layer formed from silicon and a second reflective layer formed from niobium or niobium carbide for forming a Bragg reflector; and
   a capping layer on and over the multilayer stack for protecting the multilayer stack by reducing oxidation and mechanical erosion.

9. The extreme ultraviolet reflective element as claimed in claim 8, wherein the multilayer stack includes the first reflective layer formed from silicon having a thickness from 3.5 to 4.15 nanometers and the second reflective layer formed from niobium 3.5 nanometers thick or niobium carbide 2.8 nanometers thick.

10. The extreme ultraviolet reflective element as claimed in claim 8, wherein the multilayer stack includes a barrier layer between the first reflective layer and the second reflective layer, the barrier layer formed from carbon having a thickness between 1 angstrom and 5 angstroms, and the barrier layer for reducing the formation of silicide.

11. The extreme ultraviolet reflective element as claimed in claim 8, wherein the multilayer stack includes a barrier layer between the multilayer stack and the capping layer, the barrier layer formed from carbon having a thickness between 1 angstrom and 5 angstroms for reducing the formation of silicide.

12. The extreme ultraviolet reflective element as claimed in claim 8, wherein the multilayer stack includes a barrier layer between the multilayer stack and the substrate, the barrier layer formed from carbon having a thickness between 1 angstrom and 5 angstroms for reducing the formation of silicide.

13. The extreme ultraviolet reflective element as claimed in claim 8, wherein the multilayer stack includes:
   a barrier layer between the first reflective layer and the second reflective layer, the barrier layer formed from carbon having a thickness of 5 angstroms; and
   a boundary layer of silicide between the first reflective layer and the second reflective layer, the boundary layer having a reduced thickness based on the barrier layer.

14. The extreme ultraviolet reflective element as claimed in claim 8, wherein the capping layer includes the capping layer formed from ruthenium or a ruthenium alloy and an absorber layer on and over the capping layer, the absorber layer formed from chromium, tantalum, nitrides, nickel, or a combination thereof.

15. An extreme ultraviolet reflective element production system comprising:
- a first deposition system for depositing a multilayer stack on the substrate, the multilayer stack including a plurality of reflective layer pairs having a first reflective layer formed from silicon and a second reflective layer formed from niobium or niobium carbide for forming a Bragg reflector; and
- a second deposition system for forming a capping layer on the multilayer stack for protecting the multilayer stack by reducing oxidation and mechanical erosion.

16. The extreme ultraviolet reflective element production system as claimed in claim 15, wherein the first deposition system is for forming the first reflective layer from silicon having a thickness from 3.5 to 4.15 nanometers and for forming the second reflective layer from niobium 3.5 nanometers thick or niobium carbide 2.8 nanometers thick.

17. The extreme ultraviolet reflective element production system as claimed in claim 15, wherein the first deposition system is for forming a barrier layer between the first reflective layer and the second reflective layer, the barrier layer formed from carbon having a thickness between 1 angstrom and 5 angstroms, and the barrier layer for reducing the formation of silicide.

18. The extreme ultraviolet reflective element production system as claimed in claim 15, wherein the first deposition system is for forming a barrier layer between the multilayer stack and the capping layer, the barrier layer formed from carbon having a thickness between 1 angstrom and 5 angstroms for reducing the formation of silicide.

19. The extreme ultraviolet reflective element production system as claimed in claim 15, wherein the first deposition system is for forming a barrier layer between the multilayer stack and the substrate, the barrier layer formed from carbon having a thickness between 1 angstrom and 5 angstroms for reducing the formation of silicide.

20. The extreme ultraviolet reflective element production system as claimed in claim 15, wherein second deposition system is for forming the capping layer from ruthenium or a ruthenium alloy and an absorber layer on and over the capping layer, the absorber layer formed from chromium, tantalum, nitrides, nickel, or a combination thereof.

\* \* \* \* \*